(12) United States Patent
Ellis et al.

(10) Patent No.: US 7,852,153 B1
(45) Date of Patent: Dec. 14, 2010

(54) HIGH EFFICIENCY LINEAR MICROWAVE POWER AMPLIFIER

(75) Inventors: Grant Andrew Ellis, Gelugor (MY); Miroslav Micovic, Thousand Oaks, CA (US); Keh-Chung Wang, Thousand Oaks, CA (US); JeongSun Moon, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/257,948

(22) Filed: Oct. 24, 2008

Related U.S. Application Data

(63) Continuation of application No. 11/485,037, filed on Jul. 11, 2006, now Pat. No. 7,477,102.

(60) Provisional application No. 60/783,293, filed on Mar. 17, 2006.

(51) Int. Cl.
*H03G 5/16* (2006.01)

(52) U.S. Cl. .................. 330/133; 330/129; 330/285; 330/311

(58) Field of Classification Search .......... 330/98, 330/127, 129, 133, 150, 279, 284, 285, 290, 330/297, 310, 311
See application file for complete search history.

(56) References Cited

U.S. PATENT DOCUMENTS

| | | | | |
|---|---|---|---|---|
| 5,589,796 A | * | 12/1996 | Alberth et al. | 330/285 |
| 5,604,924 A | * | 2/1997 | Yokoya | 330/297 |
| 6,020,787 A | * | 2/2000 | Kim et al. | 330/279 |
| 6,794,935 B2 | * | 9/2004 | Klomsdorf et al. | 330/285 |
| 7,170,341 B2 | * | 1/2007 | Conrad et al. | 330/296 |
| 2003/0058045 A1 | * | 3/2003 | Taylor et al. | 330/133 |

* cited by examiner

*Primary Examiner*—Khanh V Nguyen
(74) *Attorney, Agent, or Firm*—Christie, Parker, Hale

(57) ABSTRACT

A post-distortion method for cascading amplifier stages in a two-stage microwave power amplifier and a dynamic biasing method using back-end processing for correcting nonlinearity in the power amplifier output. A first or driver stage biased in a near-A region with low distortion is cascaded with a second or power stage biased in a near-C region with high efficiency. The amplitude and phase responses of the two stages compensate another to yield a more linear overall gain for the overall power amplifier. The dynamic biasing scheme modulates the source to drain voltages of the transistors used in the amplifier stages based on the harmonics in amplifier output in order to minimize the harmonics and correct nonlinearity in the output.

11 Claims, 13 Drawing Sheets

HIGH EFFICIENCY LINEAR MICROWAVE POWER AMPLIFIER

CROSS-REFERENCE TO RELATED APPLICATION

This application is a continuation of U.S. patent application Ser. No. 11/485,037 filed Jul. 11, 2006 now U.S. Pat. No. 7,477,102 which claims the benefit of the filing date of the U.S. Provisional Patent Application Ser. No. 60/783,293 filed Mar. 17, 2006, the entire contents of which are hereby expressly incorporated by reference.

BACKGROUND OF THE INVENTION

This invention relates to the field of microwave power amplifiers and more particularly to approaches for simultaneously providing both high efficiency and low third-order intermodulation (IM3) in microwave power amplifiers using Gallium Nitride High Electron Mobility Transistor (GaN HEMT) devices.

Power amplifiers are used to boost a small signal to a large signal and are highly frequency dependent. Solid state GaN amplifiers may be used in the higher frequency bandwidths. Power amplifiers generate a large amount of heat. Heat drops the gain and increases the noise figure of the amplifier. Heat also lowers amplifier efficiency.

Amplifier efficiency may be defined as the ratio of the output power delivered divided by the applied DC power which is called the drain added efficiency (DAE). It may also be defined as the ratio of the output power minus the input power divided by the applied DC power which is called the power added efficiency (PAE). Amplifier efficiency is improved if heat generation of the amplifier is controlled. Amplifier efficiency is also improved by providing proper impedances at the harmonic frequencies of the load and the source.

A set of parameters describing the scattering and reflection of traveling waves when a network is inserted into a transmission line are referred to as the scattering or S-parameters. The S-parameters are normally used to characterize high frequency networks, where simple models valid at lower frequencies cannot be applied. The S-parameters are normally measured as a function of frequency and are expressed as a complex gain including both a magnitude and a phase. For this reason, the S-parameters are often called complex scattering parameters. When the incident wave travels through the network, its value is multiplied (i.e. is gain and phase are changed) by the scattering parameter which stands for the gain of the network, thus yielding the resulting output value. So, when a wave travels through a network, the output value of the network is simply the value of the wave multiplied by the relevant S-parameter.

S-parameters can be considered as the gain of the network, and their subscripts denote the port numbers. The ratio of the output of port 2 to the incident wave on port 1 is designated S21. Likewise, for reflected waves, the signal comes in and out of the same port, hence the S-parameter for the input reflection is designated S11. For a two port network, S11 is the reflection coefficient of the input, S22 is the reflection coefficient of the output, S21 is the forward transmission gain, and S12 is the reverse transmission gain from output to input. The S-parameters are analogous to frequency response functions for high frequency circuits. The magnitude or gain of the S-parameters is expressed in units of dB or as a ratio and their phase is expressed in degrees or radians.

Most amplifiers tend to lose gain as input power level increases. This phenomenon is called gain compression. The ideal response of the device may be plotted as a straight line of a certain slope. When the actually measured output power is also plotted against the input power, the plot may stay linear at lower input power values but will start to deviate and fall with respect to the ideally linear response. Customarily, the input power at which the gain response of the device is reduced by 1 dB is defined as the compression point of the device or the one-dB compression point.

In order to obtain a high linearity power amplifier with good thermal management that would result in high efficiency, transistors with high compression points, thermal stability, and high frequency response must be used. The material properties of GaN make it a suitable candidate for high power microwave applications. GaN HEMT transistors have inherently high transconductances, which lead to better linearity, good thermal management, and high cutoff frequencies.

Power amplifiers are divided into classes such as class A, class B, class AB, class C, or classes D, E, and F. These classes do not refer to different types of transistors. Rather, changing the bias voltage of the same transistor changes its gain characteristics and therefore may change its class. In other words, the classes refer to biasing regions of the transistors forming the amplifier. Some amplifier classes provide good efficiency at the expense of linearity of response. Other classes have a highly linear response but are not highly efficient. For example, class B amplifiers have good efficiency but low linearity while class A amplifiers have good linearity and low efficiency. Class AB amplifiers represent a compromise between classes A and B. Class C has a very high efficiency but will also cause a large distortion in the signal being amplified.

During an input cycle, transistors biased near class B spend about the same amount of time turned off as they are turned on. This is regardless of input drive level. Transistors biased at class A are turned on for nearly the entire input cycle. Transistors biased at class AB are turned on somewhere between class A and class B or between 180 degrees and 360 degrees of the input cycle. There is no well-defined division between class A, class B, or class AB operation. So a class AB amplifier indicates a broad range. However, specifying the bias point using a fraction of the saturation drain current is more definite. For example a class B amplifier is biased at $0I_{DSS}$ or with an idle current of times the saturation drain current $I_{DSS}$ and a class A amplifier is biased at $0.5I_{DSS}$. Then, the approximately $0.10I_{DSS}$ is a bias point that is closer to class B than it is to class A while it can be generally referred to simply as class AB.

Nonlinear distortion in the output of a device that is characterized by appearance of frequencies that are linear combinations of the fundamental frequency present in the input signal and all the harmonics of the fundamental frequency is called intermodulation distortion. Intermodulation is referred to mixing of two signals of different frequencies to form additional signals that are not integer multiples, or harmonics, of either signal. Combining two signals of frequencies f1 and f2 into a signal of frequency, 2f1−f2 or 2f2−f1 is called third-order intermudulation (IM3). Intermodulation is not desirable because it causes nonlinearity in the output.

Because linearity in amplifier response comes at the cost of power output efficiency and vise versa, there is always a need for novel methods of improving both of these parameters simultaneously.

Further, amplifiers have been conventionally cascaded to increase efficiency. Some of the conventional cascading arrangements, however, promote intermodulation harmonics and contribute to distortion.

FIG. 1 shows a conventional arrangement of a two-stage amplifier 100 including two field effect transistor (FET) amplifiers 10, 20 that are coupled together in series. In the two-stage amplifier 100 a driver amplifier 10 precedes a power amplifier 20. A popular approach for achieving both high power and linearity simultaneously is to use pre-distortion techniques. In pre-distortion, the driver amplifier stage 10 pre-distorts the signal in such a way as to compensate for the distortion effects caused by the output power stage 20.

In the two-stage amplifier 100 of FIG. 1, the FET forming the driver stage 10 has a class B bias for high efficiency. This FET 10 is biased very close to pinch-off. As this FET 10 device is driven by increasing input power levels, the channel begins to conduct. When the input power level increases, the transconductance also increases leading to an increase in the device gain. The driver stage amplifier 10 also suffers from high distortion. The power stage 20 is usually a class AB amplifier that has low distortion but a low efficiency as well.

FIG. 2 shows a measured gain enhancement 30 for the driver stage amplifier 10 of the conventional two-stage amplifier 100 of FIG. 1. The gain expansion 30 corresponds to a driver stage amplifier 10 that is made from two GaN HEMT transistors each having a channel length of 75 μm, when the two transistors are coupled in parallel, biased near deep class AB (approximately at $0.10I_{DSS}$), and operating at 10 GHz frequency. The horizontal axis shows input power $P_{in}$ in decibel-milliwatt (dBm) units, the vertical axes show the drain current Id in mA and the gain enhancement 30 in dB. A drain current curve 40 shows an increase in the drain current Id with increasing input power Pin. As the figure shows, as the input power $P_{in}$ increases, the gain 30 expands almost 2 dB before it begins to compress.

Devices biased at class AB or A, corresponding to the second or power stage 20 of the conventional power amplifier 100, do not have gain expansion but will only compress at high enough input power levels. This phenomenon is also known as AM-AM distortion where a change in the amplitude of the input results in an undesirable distortion in the amplitude of the output. AM-PM distortion also occurs where a change in the input amplitude causes a distortion in the phase of the output. In gain compression the phase of the large signal $S_{21}$ increases while in gain expansion, the opposite occurs, that is the phase of the large signal $S_{21}$ decreases. Both of these distortion effects, AM-AM and AM-PM, are combined to offset the distortion in the final two-stage amplifier 100.

The results of driving a FET used in the power stage 20 and biased at class AB with a FET used in the driver stage 10 and biased near class B is an increase in RF efficiency and nearly flat gain over a wide range of input power $P_{in}$ levels. Sizing and biasing the FET of the driver stage 10 such that it is near the peak of its gain expansion when the FET of the power stage 20, located in the final or output stage, is compressed for a given power level can accomplish this increased efficiency and flat gain. Further, the driver stage 10 FET may be sized to be larger than the size usually used for power amplifier design. Alternatively, the driver stage 10 FET may be biased at a higher drain to source voltage $V_{DS}$. However, both of these techniques result in a decrease in amplifier efficiency.

FIG. 3 shows an IM3 variation of the two-stage amplifier 100 against an input power $P_{in}$ to the amplifier. The input power $P_{in}$ is shown on the horizontal axis in dBm units and the IM3 values 50 are shown on the vertical axis in decibel-cm (dBc) units. The FET devices are biased at 10 GHZ and at a $V_{DS}$ of 35 volts.

The resulting reduction in IM3 50 using gain compression followed by expansion is apparent in FIG. 3. The figure shows a valley or a "sweet spot" 60 where minimum IM3 50 occurs. This valley or sweet spot 60 for minimum IM3 is usually narrow.

Alternative amplifier arrangements are therefore needed that maximize gain while maintaining a low intermodulation distortion. Embodiments of this invention, disclose various approaches for simultaneously providing both high efficiency and low IM3 in a microwave power amplifier using GaN HEMT devices.

SUMMARY OF THE INVENTION

In one embodiment, a two-stage amplifier device is presented that includes a low distortion first stage amplifier, and a high efficiency second stage amplifier coupled in series to the first stage amplifier, where a signal being received by the two-stage amplifier is post-distorted by the high efficiency second stage amplifier to compensate for a distortion introduced by the low distortion first stage amplifier. In this embodiment, an output GaN HEMT device biased somewhere between class-B and class-C may be used to provide high output power and high efficiency. This amplifier may be preceded by a smaller class-A or class-AB biased GaN HEMT device to offset the effects of the AM-AM and AM-PM distortion.

In another embodiment, a dynamic biasing method for a two-stage amplifier device is presented that includes tracking input power level and output power level of the two-stage amplifier device, evaluating harmonics of the output power to produce a control signal, modulating a DC bias signal based on the control signal, and providing a modulated DC bias as drain to source voltages to the two-stage amplifier device as feedback to correct nonlinearity in output power of the two-stage amplifier by back-end processing. In this embodiment, the two-stage amplifier device includes a low distortion first stage amplifier and a high efficiency second stage amplifier.

In yet another embodiment, a dynamically biased power amplifier system is presented that includes a two-stage amplifier device formed from first and second amplifiers coupled in series. The two-stage amplifier device has a two-stage amplifier input responsive to a signal to be amplified, first and second feedback inputs, and a two-stage amplifier output. A directional coupler is also included that has a system output and an input coupled to the two-stage amplifier output and provides a system output signal at the system output and samples forward and reflected signals from the two-stage amplifier. A digitizer is also included that is responsive to sampled forward and reflected signals from the directional coupler. A processor is coupled to the digitizer, for evaluating harmonics of digitized sampled forward and reflected signals. A modulated DC power supply source is coupled between the processor and the two-stage amplifier device, that receives a DC bias and modulates the DC bias according to a modulating signal received from the processor and provides modulated DC bias to the first and second feedback inputs of the two-stage amplifier device. In this embodiment, the modulated DC bias varies a drain to source voltage of the first and second amplifiers, and the first and second amplifiers include a low distortion first stage amplifier and a high efficiency second stage amplifier. In this embodiment, the drain, source, and gate bias voltages are dynamically determined to simultaneously provide optimum efficiency and low IM3 for various input power levels.

DETAILED DESCRIPTION

Figure 1:
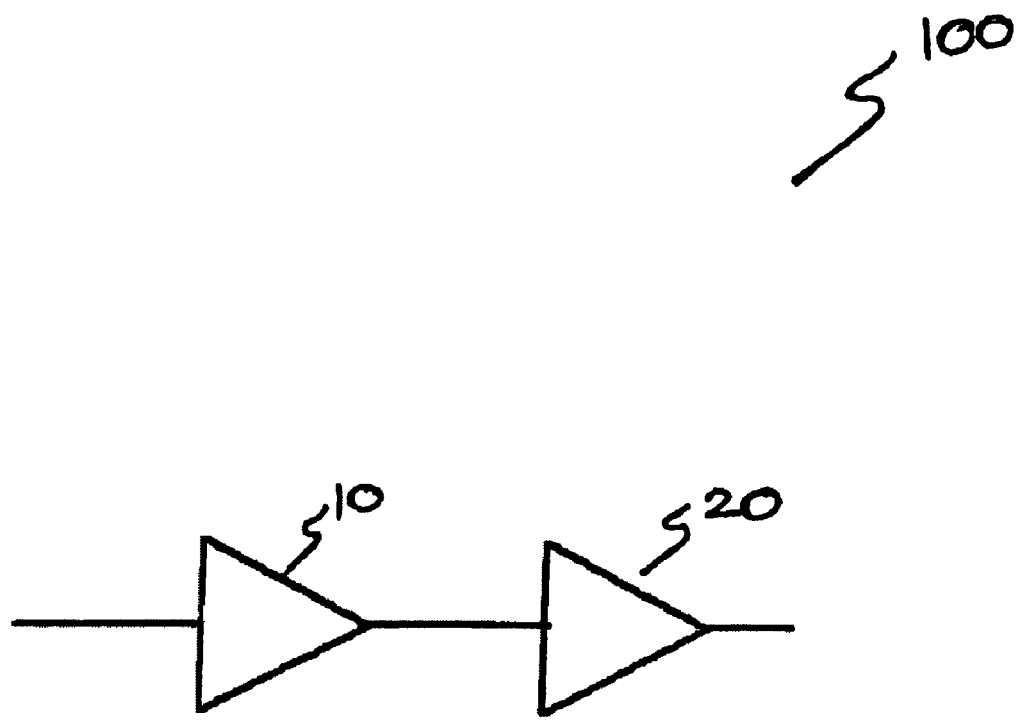
FIG. 1 shows a conventional arrangement of two field effect transistor amplifiers in a two-stage amplifier.
Figure 4:
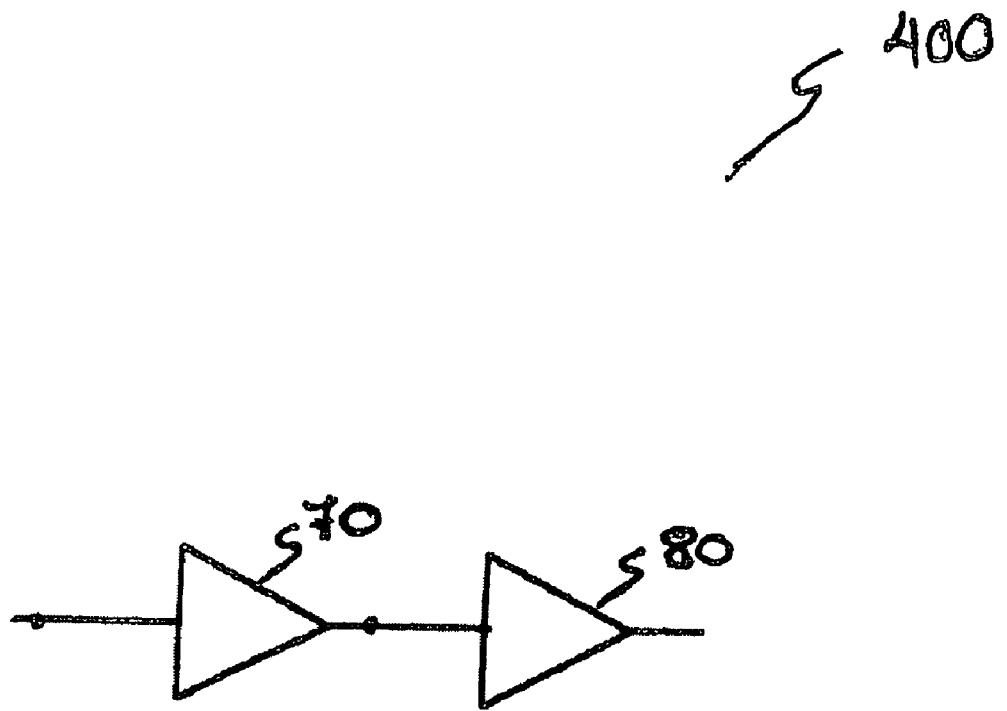
FIG. 4 shows an exemplary arrangement of amplifier stages according to the present invention.

FIG. 4 shows a two-stage amplifier 400 including an exemplary arrangement of amplifier stages according to the embodiments of the present invention. In this embodiment, the pre-distortion biasing scheme used for the FETs of the two stages 10, 20 shown in FIG. 1 is reversed. In other words, in two-stage amplifier 400 of this figure, a driver amplifier 70 is formed by a class A or class AB amplifier and is followed by a power or final stage amplifier 80 formed by a class B or class C amplifier. This arrangement presents a post-distortion approach to the linearity problem.

Figure 2:
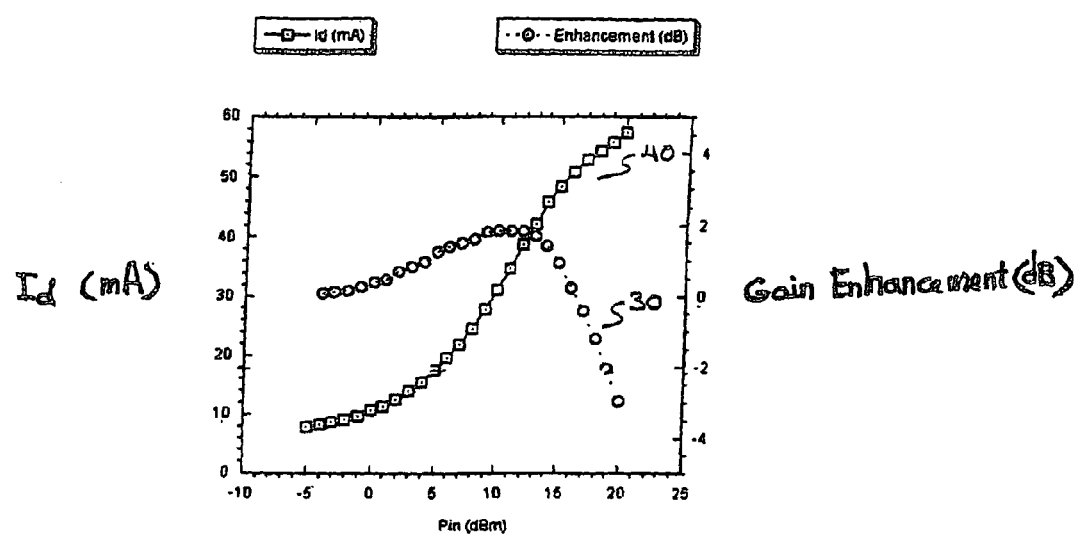
FIG. 2 shows a measured gain enhancement for a driver stage of the two-stage amplifier of FIG. 1.

Class C amplifiers, despite their high efficiency, are rarely used in the field because their output suffers from a high degree of distortion and needs filtering. At the same time, gain expansion or gain enhancement, such as that shown in FIG. 2, mostly occurs in the high efficiency class C mode.

Combining gain expansion with class C amplifier operation offers a novel approach for compensating for the effects of gain compression, typical in power amplifiers, while including the higher efficiency attributes of the class C amplifier stage. Class C bias for the output stage 80 yields a higher possible efficiency, (78%) than an output stage biased with class AB or class B. For the driver stage 70, a class A or nearly class A bias is used to provide the necessary phase and amplitude distortion (AM-AM, AM-PM) to compensate for the distortion in the output stage 80. By reversing the order of biasing, a much smaller device can be used as the driver 70 thus improving overall efficiency.

Figure 3:
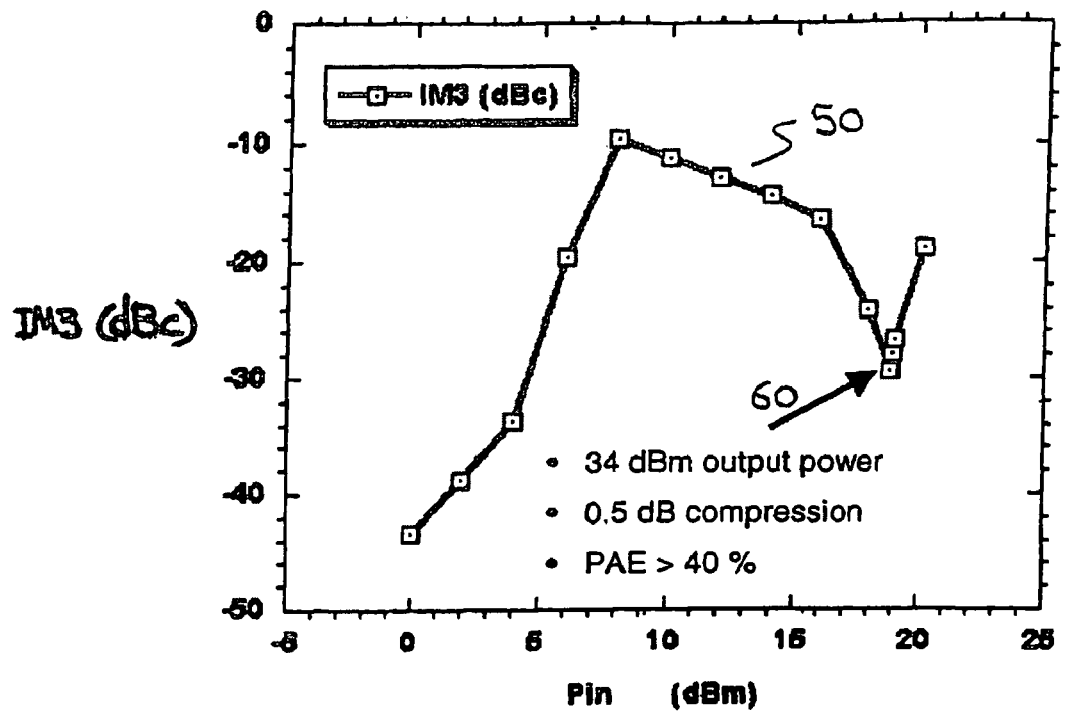
FIG. 3 shows an IM3 variation of the two-stage amplifier of FIG. 1 against input power to the amplifier.

One of the features of the present invention is that it broadens the sweet spot 60 region shown in FIG. 3 over a greater range of input power levels $P_{in}$. Another feature positions this sweet spot 60 for minimum IM3 at different input or output power levels. With these two features, the range of input power levels or amplifier dynamic range is increased while simultaneously the IM3 50 level is kept low and the efficiency is kept high. Varying the drain to source bias voltage $V_{DS}$ levels of the driver amplifier and the final amplifier, in a two-stage amplifier, helps achieve these simultaneous benefits. In other words, at low input power $P_{in}$ levels, $V_{DS1}$ and $V_{DS2}$ are set low and at high input power levels $P_{in}$, $V_{DS1}$ and $V_{DS2}$ are set high.

Figure 5:
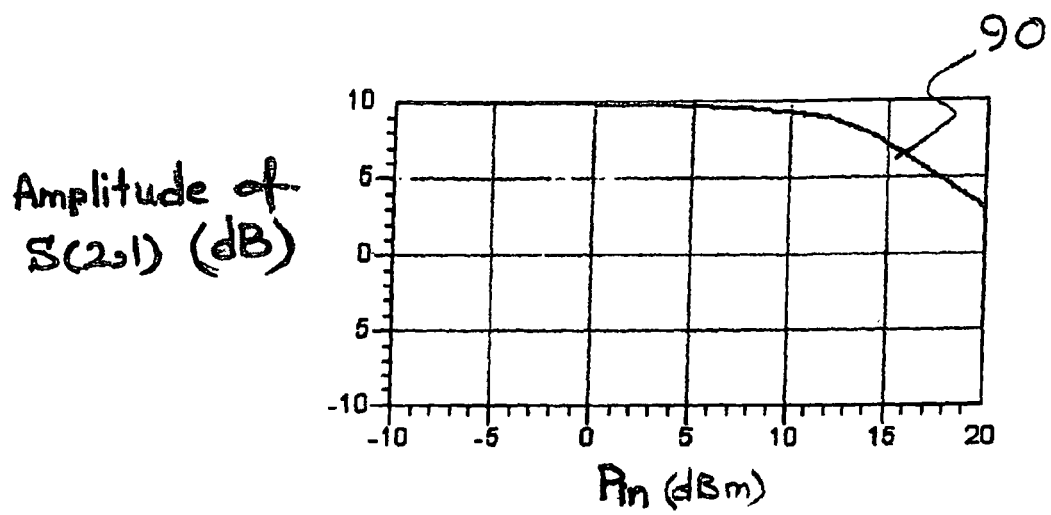
FIG. 5 shows an amplitude response of a first stage of the amplifier of FIG. 4.
Figure 6:
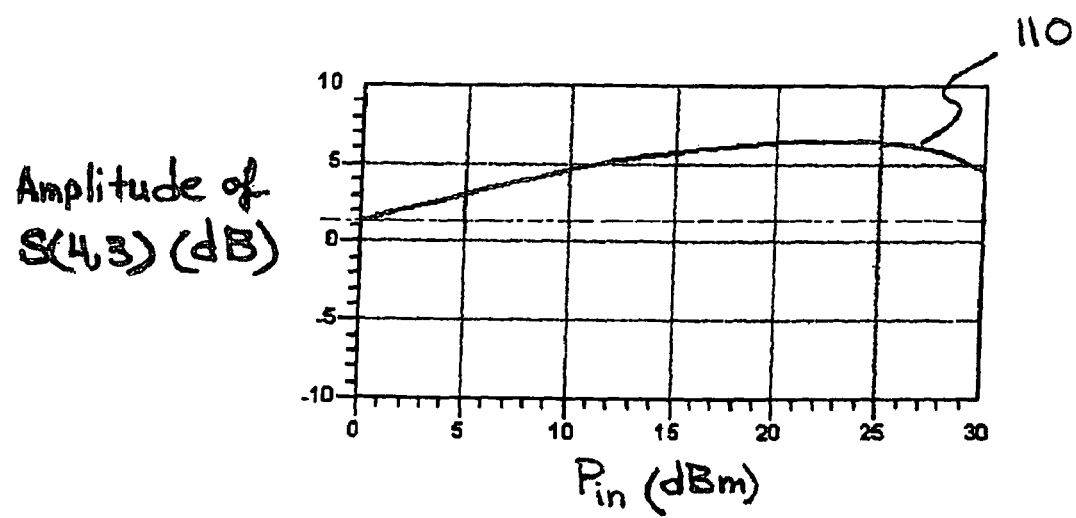
FIG. 6 shows an amplitude response of a second stage of the amplifier of FIG. 4.
Figure 7:
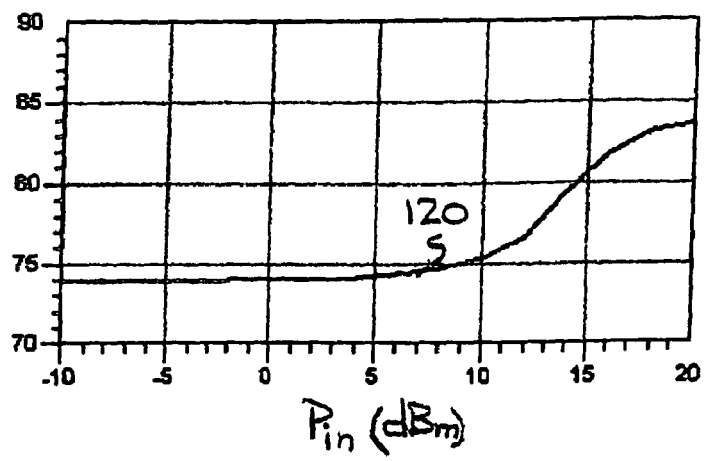
FIG. 7 shows a phase response of the first stage of the amplifier of FIG. 4.
Figure 8:
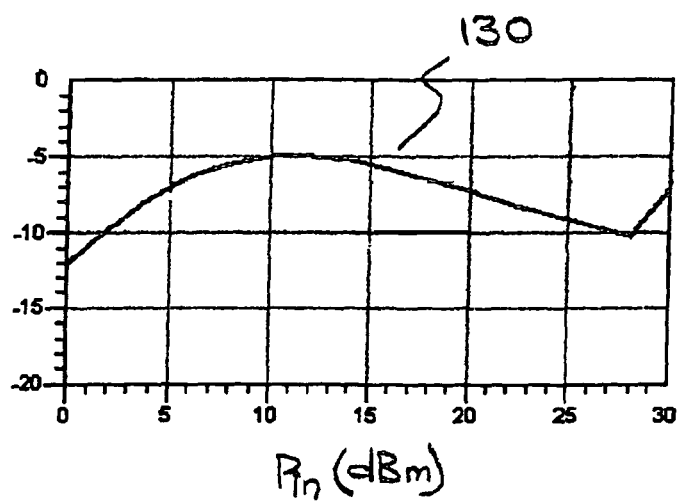
FIG. 8 shows a phase response of the second stage of the amplifier of FIG. 4.

FIGS. 5, 6, 7, and 8 show simulated amplitude and phase responses of the driver 70 and output 80 stages from their respective simulated large signal S-parameters. These four figures all include the input power $P_{in}$ on the horizontal axis. FIGS. 5 and 7 show the S-parameter S(2,1) on the vertical axis and FIGS. 6 and 8 show the S-parameter S(4,3) on the vertical axis. Amplitudes or magnitudes of the S-parameters appearing in FIGS. 5 and 6 are expressed in units of dB. The phases of the S-parameters shown in FIGS. 7 and 8 are in units of degrees. The numerical values of the four figures are derived using four parallel FETs each having a 40 μm channel length in the first stage 70 and six parallel FETs each having a 100 μm channel length in the second stage 80.

FIGS. 5 and 7 show the compression in the amplitude 90 and the positive increase in the phase 120 of the first stage 70 that corresponds to the characteristics of a class A biased device. The biasing parameters used to obtain the curves of these figures include a $V_{DS1}$ of 10 volts and a $V_{GS1}$ of –0.4 volts.

FIGS. 6 and 8 show the amplitude 110 expansion and negative phase response of the phase 130 of the second stage 80 that are typical for a class C biased device. The biasing parameters used to obtain the curves of these figures include a $V_{DS2}$ of 20 volts and a $V_{GS2}$ of –3.6 volts.

As is apparent in FIGS. 5 and 6, the amplitudes 90, 110 of the first stage 70 and the second stage 80 amplifiers compensate each other. For example, at $P_{in}$ value of 20 dBm, the amplitude 90 of the first stage 70, shown in FIG. 5, is at a low point while the amplitude 110 of the second stage 80, shown in FIG. 6, is at a high point. Referring to FIGS. 7 and 8, the phases 120, 130 of the first and second stages 70, 80 similarly compensate each other.

Figure 9A:
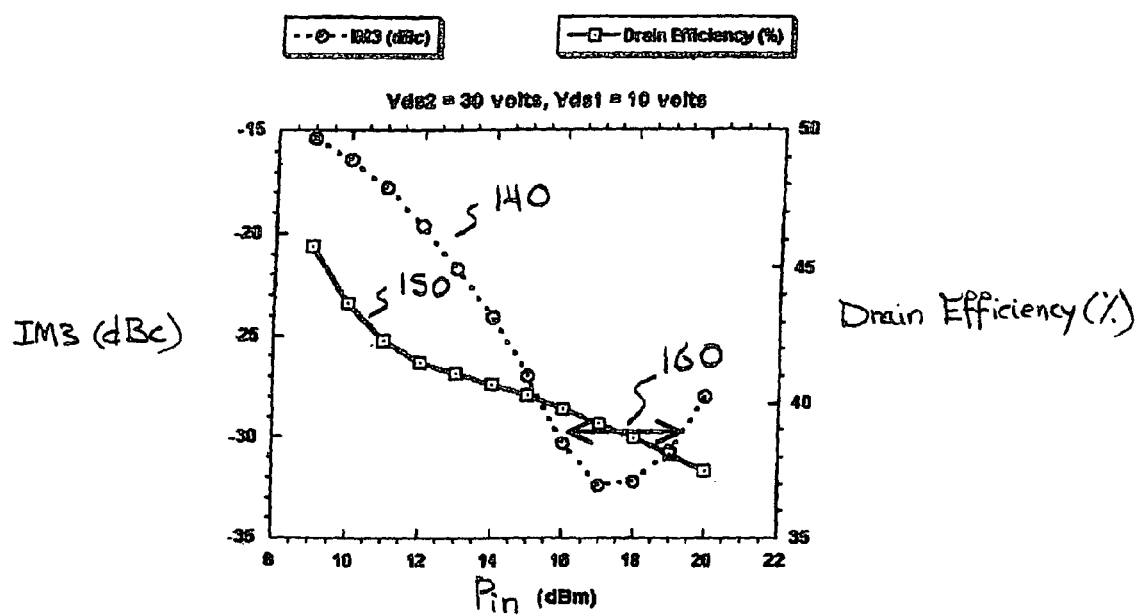
FIG. 9a shows improved IM3 and drain efficiency of the amplifier of FIG. 4 given a first set of gate to source voltages.
Figure 9B:
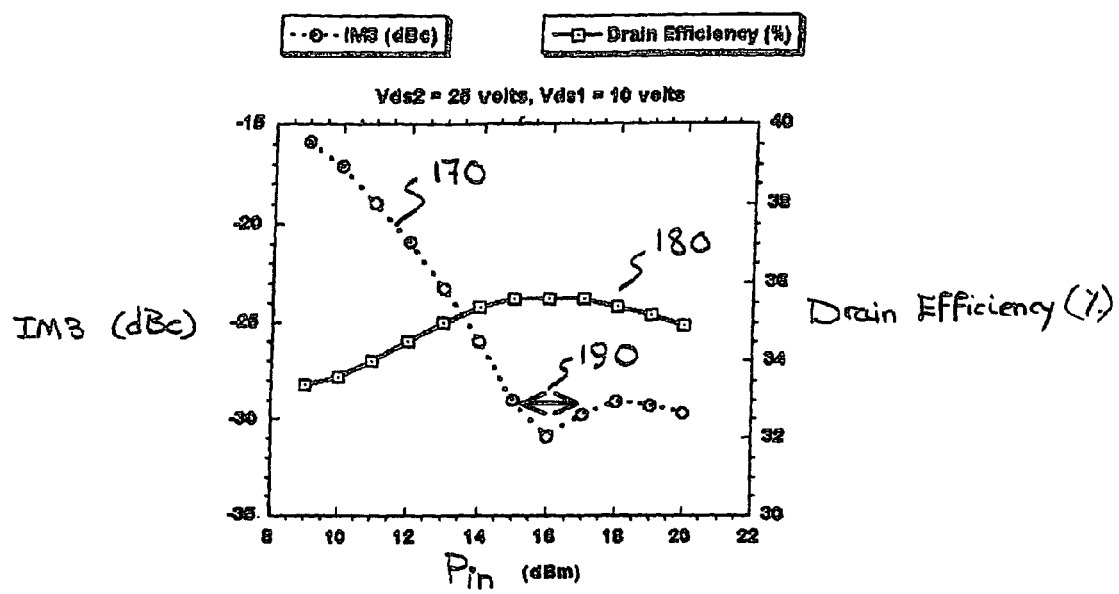
FIG. 9b shows improved IM3 and drain efficiency of the amplifier of FIG. 4 given a second set of gate to source voltages.

FIGS. 9a and 9b show the simulated improved IM3 140, 170 and drain efficiency 150, 180 of the amplifier of FIG. 4 given a first and a second set of gate to source voltages. These figures again pertain to the post-distortion scheme for the two-stage power amplifier 400 using GaN double heterostructure field effect transistors (DHFETs). A low IM3 level 140, 170 and high drain efficiency 150, 180 are achieved over a wider range of input power levels 160, 190 than what is available in the prior art.

In both simulations, whose results appear in FIGS. 9a and 9b, the center frequency was f=10 GHz and the frequency range was Δf=2 MHz. In the first simulation, whose results appear in FIG. 9a, the gate to source voltage of the first stage 70 transistor is $V_{SG1}$=–0.48 volts and that of the second stage 80 transistor is $V_{GS2}$=–3.6 volts. In the second simulation, whose results appear in FIG. 9b, the gate to source voltage of the first stage 70 transistor is $V_{SG1}$=–0.49 volts and that of the second stage 80 transistor is $V_{GS2}$=–3.45 volts. $V_{DS1}$ and $V_{DS2}$ are the drain to source voltages of the transistors used in the first 70 and second 80 stages that are output by each stage of the two-stage amplifier 400. In the first simulation $V_{DS1}$=10 volts and $V_{DS2}$=30 volts. In the second simulation $V_{DS1}$=25 volts and $V_{DS2}$=10 volts.

In FIG. 9a, the upper and lower horizontal axes show the input power $P_{in}$ in units of dBm and the left and right vertical axes show the IM3 140 in dBc and the drain efficiency 150 as a percentage. The results of the first simulation indicate an improved IM3 of less than −32 dBc with drain efficiency of greater than 38% with an input power level $P_{in}$ between 17 and 18 dBm in the sweet spot 160 valley of this IM3 curve.

In FIG. 9b, similarly, the upper and lower horizontal axes show the input power $P_{in}$ and the left and right vertical axes show the IM3 170 and the drain efficiency 180. The results of the second simulation indicate an improved IM3 of less than −32 dBc with drain efficiency of greater than 35% with an input power level $P_{in}$ of 15.5 dBm in the sweet spot 190 valley of this IM3 curve 170.

Figure 10:
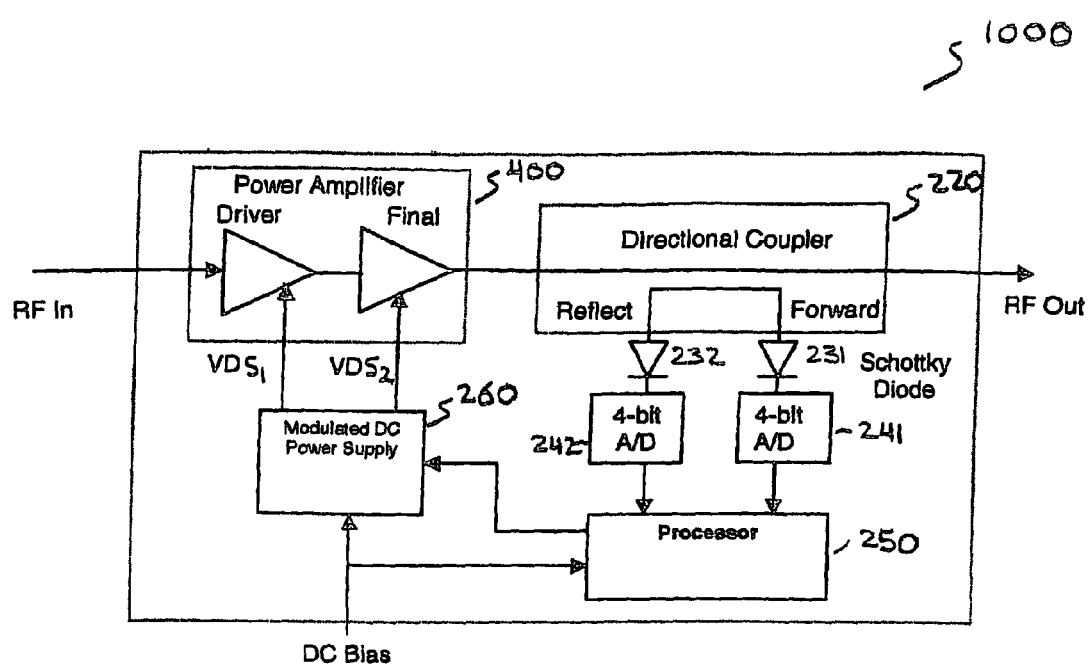
FIG. 10 shows a block diagram of a system incorporating the amplifier of the invention.
Figure 11:
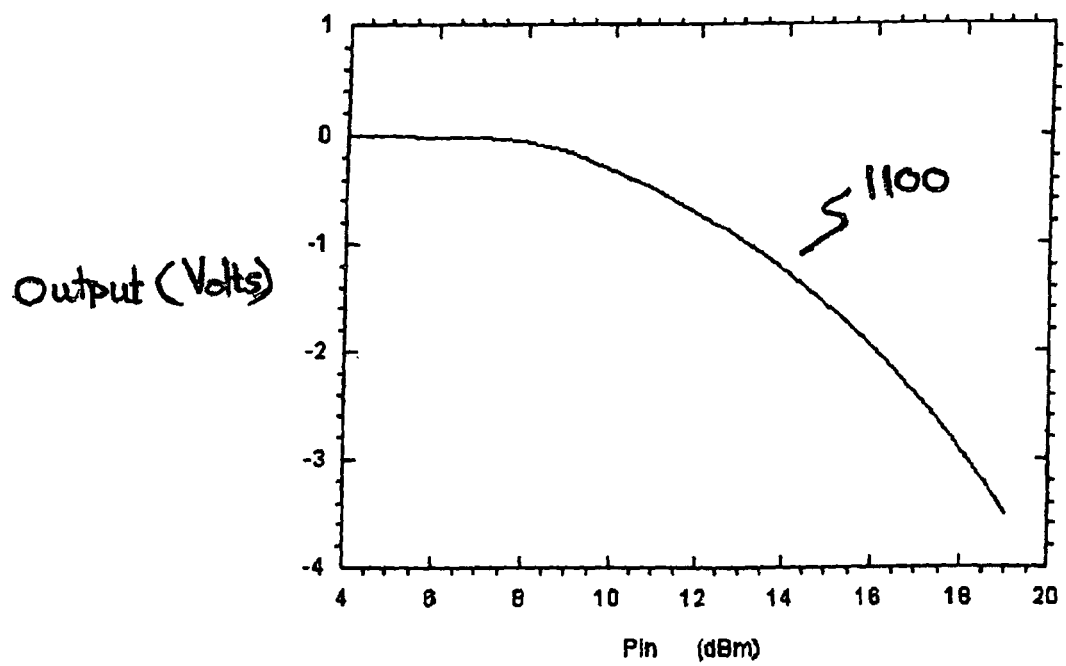
FIG. 11 shows transfer characteristics of a generic GaN Schottky diode used in the system of FIG. 10.
Figure 12:
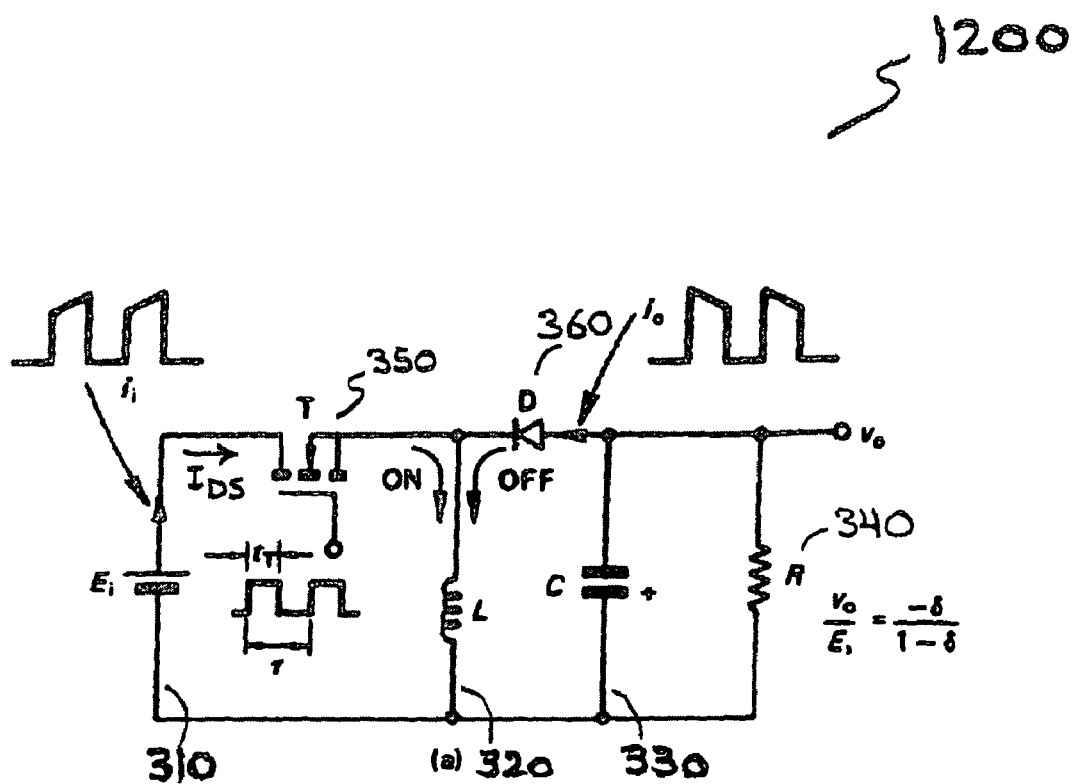
FIG. 12 shows a conventional Buck-Boost converter used in the system of FIG. 10.

FIG. 10 shows a block diagram of a system incorporating an embodiment of the invention. FIG. 11 shows transfer characteristics of a generic GaN Schottky diode used in the system of FIG. 10. FIG. 12 shows a conventional Buck-Boost converter used in the system of FIG. 10.

An embodiment of the invention that includes an on-chip system 1000 using dynamic biasing for RF power amplification is shown in FIG. 10. This system 1000 includes feedback provided to the amplifier 400 in order to correct for nonlinearity of the amplifier 400 through back-end processing. The RF output power from the two-stage power amplifier 400 is sampled on-chip using a directional coupler 220. The output of the directional coupler 220 is the output of the overall dynamically biased feedback system 1000. The directional coupler 220 can be a simple quarter wave (λ/4) coupled line.

Two analog-to-digital (A/D) converters 241, 242 are used to sample and quantize the forward and reflected traveling waves using two Schottky diodes 231, 232. The combination of the Schottky diodes 231, 232 and the A/D converters 241, 242 behave as a digitizer for the forward and reflected traveling waves that are sampled by the directional coupler 220.

This system allows the power in the output envelope of the amplifier 400 to be tracked. These diodes 231, 232 are easily realized using GaN transistors. The outputs of the A/D converters 241, 242 are fed into a processor 250. The processor 250 monitors the output of the amplifier 400 received through the coupler 220 and evaluates the harmonics of the output. The processor 250 then provides a signal that changes the drain voltages of the transistors used in the amplifier 400 in order to minimize the harmonics in the amplifier 400 output. In other words, the processor 250 provides a negative feedback loop in order to minimize the harmonics output by the amplifier 400. The output of the processor 250 is provided to a modulated DC power supply 260 which provides the drain to source voltages $V_{DS1}$, $V_{Ds}2$ of the transistors used in the amplifier 400. A DC bias is provided to both the processor 250 and the modulated DC power supply 260. This system 1000 corrects the non-linearity of the amplifier 400 output by back-end processing rather than dynamic gate biasing.

In one exemplary embodiment of the invention, the Schottky diodes 231, 232 of the system 1000 may be implemented with the transfer characteristics shown in FIG. 11. FIG. 11 shows the measured conversion characteristics 1100 for a GaN Schottky diode with a channel length of 150 μm operating at 15 GHz. The horizontal axis shows the input power $P_{in}$ in dBm and the vertical axis shows the output voltage of the diode in volts. As the figure shows, for an input power range of 4 to 20 dBm the resulting output voltage varies from 0 to −4 volts. These voltage levels can be sampled on-chip 1000 using the A/D converters 241, 242.

In one embodiment, 3-bit A/D converters (not shown) have been realized in GaAs using 56 metal semiconductor field effect transistors (MESFETs). This scheme provides the ability to track the input/output power levels and vary the $V_{DS}$ to obtain low IM3 and high efficiency.

In various embodiments, the sampled forward and reflected waves at the output of the power amplifier 400 can go to an on-chip processor 250 or an off-chip processor (not shown). The processor then determines the necessary bias voltage for the power amplifier 400 to control the appropriate output power, efficiency, and IM3 level.

In one embodiment, the power supply 260 being modulated by the processor 250 can be a Buck-Boost converter 1200 shown in FIG. 12 to vary the level of $V_{DS1}$ and $V_{DS2}$. At low input power levels, $V_{DS1}$ and $V_{DS2}$ are set low and at high input power levels, $V_{DS1}$ and $V_{DS2}$ are set high. This allows the low IM3 sweet spot 160, 190 to vary for a wide range of input or output power levels. The Buck-Boost converter 1200 of FIG. 12 includes a DC bias source or a battery 310, an inductor 320, a capacitor 330, a resistor or a load 340, a transistor 350, and a diode 360 coupled together. The capacitor 330 and the load 340 are coupled in parallel to form an RC circuit. The inductor 320 and the battery 310 are each coupled to one node of the RC circuit. The other node of the inductor 320 is coupled to the other node of the RC circuit through the diode 360 that allows the current to flow only from the RC circuit to the inductor 320 and not back. The node of the inductor 320 coupled to the diode 360 is also coupled to the transistor 350. The transistor 350 is coupled between the battery 310 and the inductor 320.

In the Buck-Boost converter 1200 of FIG. 12, when the transistor 350 is on, energy is transferred to the inductor 320. When the transistor 350 turns off, inductor current is forced through the diode 360. Energy stored in the inductor 320 is transferred to the capacitor 330 and the load 340. The switching frequency is determined using an on chip oscillator. Also, the main energy storage elements, the inductor 320 and the capacitor 340, can be located off-chip.

Although the present invention has been described with reference to certain exemplary embodiments, it is understood that a variety of modifications and variations may be made to the present invention without departing from the spirit or scope of the invention defined in the appended claims, and their equivalents.

What is claimed is:

1. A two-stage amplifier device comprising:
   a low distortion first stage amplifier;
   a high efficiency second stage amplifier coupled in series to the first stage amplifier; and
   a feedback unit for dynamically adjusting a biasing of at least one of the first stage amplifier or the second stage amplifier in accordance with harmonics of an output of the two-stage amplifier device,
   wherein the high efficiency second stage amplifier is adapted to post-distort a signal being received by the two-stage amplifier device to compensate for a distortion introduced by the low distortion first stage amplifier.

2. The two-stage amplifier device of claim 1, wherein the low distortion first stage amplifier is a class A biased amplifier.

3. The two-stage amplifier device of claim 1, wherein the low distortion first stage amplifier is a class AB biased amplifier.

4. The two-stage amplifier device of claim 1, wherein the high efficiency second stage amplifier is a class B biased amplifier.

5. The two-stage amplifier device of claim 1, wherein the high efficiency second stage amplifier is a class C biased amplifier.

6. The two-stage amplifier device of claim 1, wherein the low distortion first stage amplifier and the high efficiency second stage amplifier are Gallium Nitride double heterostructure field effect transistors.

7. The two-stage amplifier device of claim 1, wherein the low distortion first stage amplifier and the high efficiency second stage amplifier are Gallium Nitride high electron mobility transistors.

8. A two-stage amplifier device comprising:
a low distortion first stage amplifier;
a high efficiency second stage amplifier coupled in series to the first stage amplifier; and
a feedback unit for dynamically adjusting a biasing of at least one of the first stage amplifier or the second stage amplifier in accordance with harmonics of an output of the two-stage amplifier device,
wherein a signal being received by the two-stage amplifier device is post-distorted by the high efficiency second stage amplifier to compensate for a distortion introduced by the low distortion first stage amplifier, and
wherein the harmonics of the output of the two-stage amplifier device comprise a third-order intermodulation.

9. A method for biasing a two-stage amplifier device having a first stage amplifier coupled to a second stage amplifier, the method comprising:
biasing the first stage amplifier at a near-A bias;
biasing the second stage amplifier at a near-C bias; and
biasing at least one of the first stage amplifier or the second stage amplifier in accordance with harmonics of an output of the two-stage amplifier device,
wherein the harmonics of the output of the two-stage amplifier device comprise a third-order intermodulation.

10. A two-stage amplifier device comprising:
a low distortion first stage amplifier;
a high efficiency second stage amplifier coupled in series to the first stage amplifier such that the high efficiency second stage amplifier is adapted to post-distort a signal being received by the two-stage amplifier device to compensate for a distortion introduced by the low distortion first stage amplifier; and
a feedback unit for dynamically adjusting a biasing of at least one of the first stage amplifier or the second stage amplifier in accordance with harmonics of an output of the two-stage amplifier device.

11. A two-stage amplifier device comprising:
a first means for amplifying a signal being received by the two-stage amplifier device;
a second means for amplifying the signal to compensate for a distortion introduced by the first means; and
means for dynamically adjusting a biasing of at least one of the first means or the second means in accordance with harmonics of an output of the two-stage amplifier device,
wherein the first means has lower distortion than the second means, and the second means has higher efficiency than the first means.

* * * * *